United States Patent [19]
Smith, III

[11] Patent Number: 5,502,728
[45] Date of Patent: Mar. 26, 1996

[54] LARGE, FAULT-TOLERANT, NON-VOLATILE, MULTIPORTED MEMORY

[75] Inventor: Thomas B. Smith, III, Wilton, Conn.

[73] Assignee: International Business Machines Corporation, Armonk, N.Y.

[21] Appl. No.: 837,528

[22] Filed: Feb. 14, 1992

[51] Int. Cl.⁶ .............................. G06F 11/00; G06F 11/08
[52] U.S. Cl. ................................. 395/182.03; 371/51.1; 371/36
[58] Field of Search ........................ 371/1, 8.1, 7, 10.1, 371/11.1, 38.1, 39.1, 66, 51.1, 10.2, 37.6, 40.1, 36, 14

[56] References Cited

U.S. PATENT DOCUMENTS

| | | |
|---|---|---|
| 4,239,982 | 12/1980 | Smith et al. |
| 4,653,050 | 3/1987 | Vaillancourt ............................ 371/10.1 |
| 4,884,242 | 11/1989 | Lacy et al. ................................. 371/66 |
| 4,907,232 | 3/1990 | Harper et al. ............................. 371/36 |
| 5,058,115 | 10/1991 | Blake et al. ............................ 371/40.1 |
| 5,168,495 | 12/1992 | Smith ..................................... 370/85.6 |
| 5,269,016 | 12/1993 | Butler et al. ........................... 371/11.3 |
| 5,325,519 | 6/1994 | Long et al. ............................. 395/575 |

Primary Examiner—Robert W. Beausoliel, Jr.
Assistant Examiner—Albert Decady
Attorney, Agent, or Firm—Roy R. Schlemmer; Ronald L. Drumheller

[57] ABSTRACT

A large, fault tolerant, highly reliable semiconductor data storage system (memory) is designed to have the memory function striped across multiple symbol planes which comprise individual fault containment regions. Each fault containment region includes such a symbol plane which, in turn, stores at least one bit of any given memory word accessed in the system. The system further includes a processing core module, including at least symbol plane addressing controls, and a channel adapter is provided for selectively connecting the memory to high speed communications channels for, in turn, communicating with client processors or other functional entities attached to the data store system. The processing core contains an error correction/detection mechanism for the error checking and correction of all data fetched from the memory and for generating error correction and detection code bits for all data to be stored in memory. The complete processing core is triplicated to form three identical processing core rails. Each rail is connected on one side to data links to all of the symbol planes, and on the other side to data links to all I/O channel link adaptors. Each symbol plane and each channel link adaptor also includes voter means for selecting a majority vote output for any communication received from the processing core rails.

17 Claims, 8 Drawing Sheets

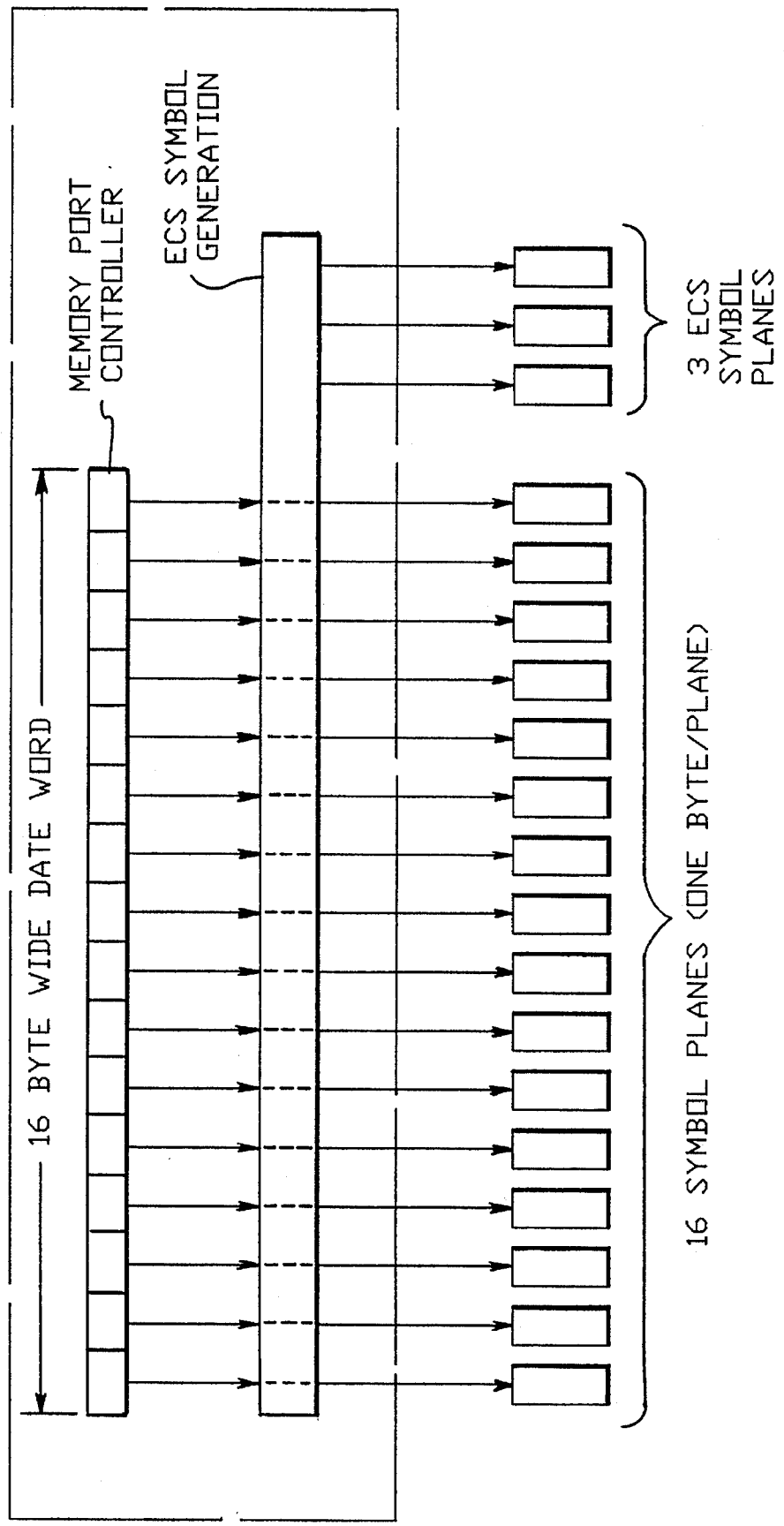

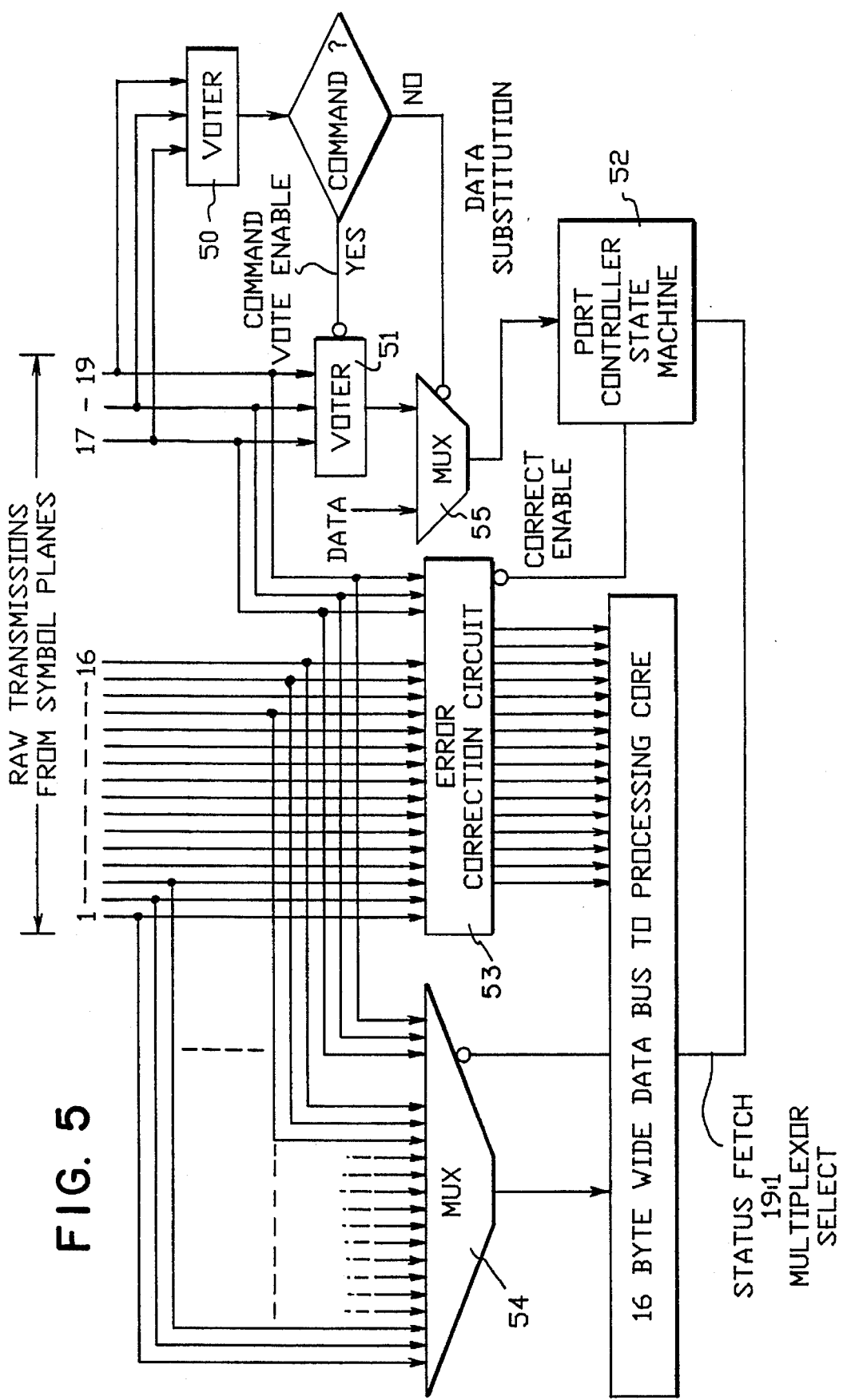

FIG. 6
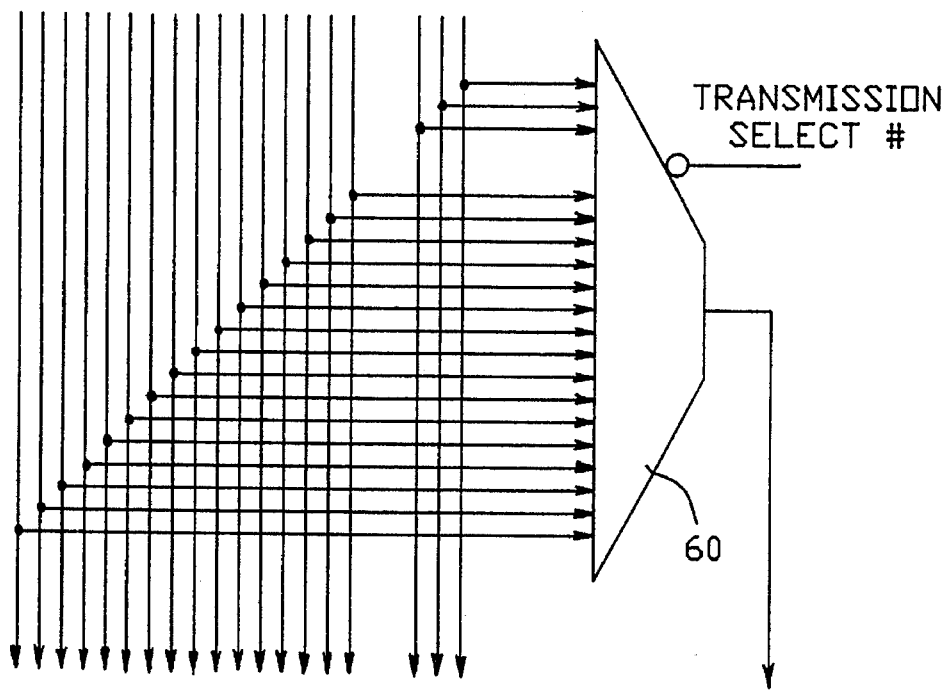
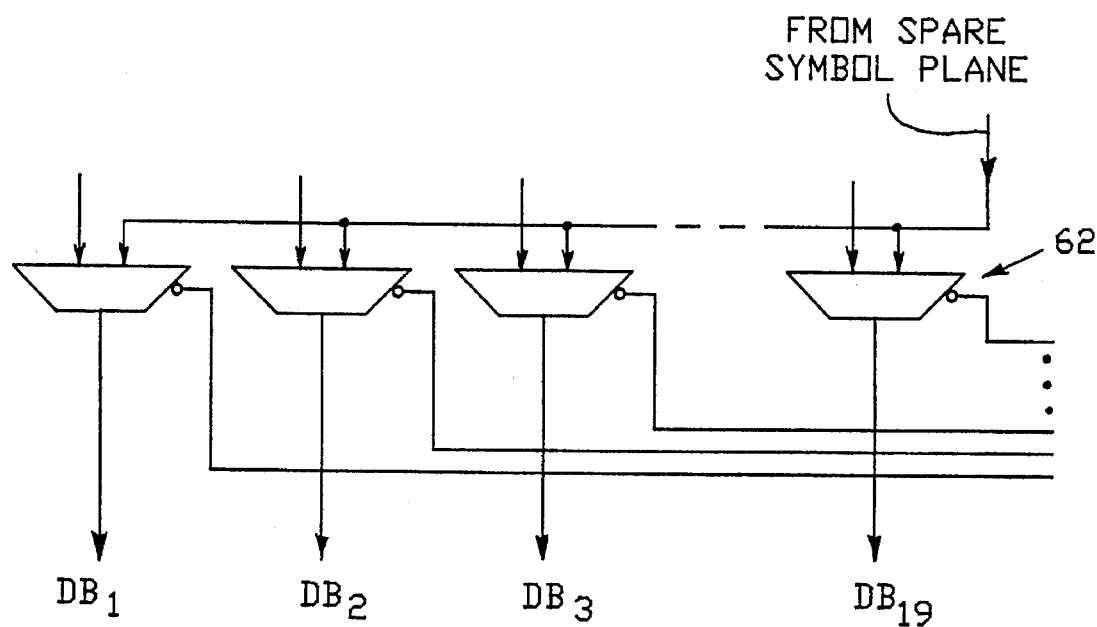

FIG. 7A

SYMBOL PLANE TO
PORT CONTROLLER
SCRUB FRAME FORMAT

| IDLE | SRUB | DATA | DATA | DATA | DATA | DATA | DATA | DATA | ... | DATA | DATA | IDLE OR RESPONSE |
|------|------|------|------|------|------|------|------|------|-----|------|------|------------------|

FIG. 7B

PORT CONTROLLER
TO SYMBOL PLANE
SCRUB FRAME FORMAT

| IDLE | SRUB | DATA | DATA | DATA | DATA | DATA | DATA | DATA | ... | DATA | DATA | IDLE OR COMMAND |
|------|------|------|------|------|------|------|------|------|-----|------|------|-----------------|

LARGE, FAULT-TOLERANT, NON-VOLATILE, MULTIPORTED MEMORY

CROSS REFERENCE TO RELATED APPLICATIONS

The invention described in this application is related to an invention disclosed in application Ser. No. 07/698,685; now U.S. Pat. No. 5,168,495 of T. B. Smith, filed on May 10, 1991 entitled "Nested Frame Communication Protocol" and assigned to the assignee of this application. The disclosure of application Ser. No. 07/698,685 is incorporated herein by reference.

The present invention is also related to another invention of the inventor herein, disclosed in U.S. Pat. No. 5,020,023 entitled "Automatic Vernier Synchronization of Skewed Data Streams" and assigned to the assignee of this application. The disclosure of U.S. Pat. No. 5,020,023 is also incorporated herein by reference.

FIELD OF THE INVENTION

The present invention relates to the architectural design of large semiconductor based, fault-tolerant and non-volatile, memory systems, of order 4 to 128 gigabytes, for use with large data base applications such as on-line transaction processing systems (OLTPS). More particularly it relates to such memory systems where error-free operation, and the sharing of data among applications and among multiple computers are significant design criteria in addition to size and speed.

BACKGROUND OF THE INVENTION

Semiconductor based storage has traditionally been employed as the main storage component of computers, and as the storage medium ill cached disk control units. In On-Line Transaction Processing (OLTP) systems much of the main storage is used to buffer disk storage data blocks, an application that is similar in character to the cacheing functions of disk control units. Buffering and cacheing minimize the numbers of physical disk accesses by intercepting READ requests to disk, providing the requested data from main storage buffers or from caches in the disk controller. Main memory buffering can substantially reduce the burden on the computer's I/O subsystem and on the disk actuators since READ requests that are intercepted by main memory buffering result in no I/O or disk activity. READ requests which are satisfied from disk controller caches still require the computer to initiate I/O channel operations but they eliminate actual disk actuator activity, and since the latency for a READ that is satisfied from cache is small, I/O channel occupancy is greatly reduced. Reduction in physical disk activity is particularly important, since each disk actuator can only service from 20 to 40 random access requests per second, the exact number depending upon the disk model and specific access patterns. As processor speeds improve and transaction rates and complexity increase, it thus becomes important to minimize the number of physical disk accesses so that they can be satisfied by an economic number of disk actuators.

For example, if a system is processing 1000 transactions per second and each transaction accesses (READS or WRITES) 40 data items, then without cacheing or buffering the disk subsystem would need to support 40,000 disk operations per second. If these accesses could be spread without skew across all available disk actuators, then some 2000 disk actuators would be required. Skew effects make this a minimum requirement ill most systems. If 90% of the READ requests can be intercepted by main memory buffers or disk caches, and if only 15% of the access requests are WRITES, then the burden on disk actuators is reduced by 75%. Note that both techniques, in addition to reducing disk accesses, substantially reduce the latency to availability of the requested data. This results in greater efficiencies and less potential conflict between parallel execution of transactions, and the multi-programming levels within the computer can be correspondingly reduced. It also reduces transaction response times. Cacheing within the disk control unit, which has somewhat greater latencies than main memory buffering, has a significant advantage over main memory buffering when the disk data is being shared among several computers, since it permits straightforward sharing of data. With main memory buffering, this is not straight forward as some mechanism must be provided for invalidating buffered data in one computer when the underlying disk data is modified by another computer.

It should be noted that as buffer and cache sizes increase, a larger fraction of READ requests are intercepted. Ultimately with large enough memories, virtually all READ requests can be satisfied from buffers or cache. In such systems, disk activity is dominated by the need to WRITE all updates, modifications, or additions through to disk. This requirement to reflect all writes to disk is driven by the vastly better integrity characteristics of disk (magnetic) storage when compared to conventionally designed main storage or disk controller cache memory (semiconductor storage). Since write or update activities constitute a significant fraction of disk requests for most OLTP workloads, the sizing and throughput of a conventional OLTP system is thus ultimately limited by the capacity and characteristics of the supporting disk actuators, even when vast amounts of semiconductor memory are installed.

A primary motivation for this invention is thus to improve the integrity characteristics of a large semiconductor based storage subsystem so that it can be used for storage of data without reflecting modifications or updates to disk. Since disk data is frequently mirrored (duplexed) in contemporary systems, such a memory must be fault-tolerant and non-volatile to compete effectively against disk based storage's integrity profile. This permits a database to entirely reside in this semiconductor memory, without any disk backing. It also allows write-back cacheing of disk based databases. Write-back cacheing, instead of write-through cacheing provides continued reductions in the numbers of disk accesses with the addition of memory since both READS and WRITES can be intercepted. Ultimately all disk accesses are effectively eliminated when the cache becomes large enough.

The preferred embodiment of this invention, disclosed herein, additionally seeks to position this fault-tolerant and non-volatile memory so that it can be easily shared among a plurality of client computers, facilitating the construction of very large transaction processing systems. Toward this goal, fault-tolerant, processor components are embedded within the fault-tolerant non-volatile memory to provide an intelligent fault-tolerant non-volatile memory subsystem that can be shared among several client computers for shared cacheing of data, and for the complete storage of data bases that will fit.

DESCRIPTION OF THE PRIOR ART

There are several fault tolerant computer designs which constitute the most relevant prior art. Specifically, Stratus Computer Inc., and Tandem Computer Inc. manufacture and sell fault tolerant computers (e.g., respectively the Stratus XA2000 computer models, and the Tandem Integrity computer models) which could provide the desired integrity profile for shared data storage and cacheing functions, provided they were augmented with appropriate software and I/O attachments. Providing such augmentations is a routine system integration task, and is within the state of the art. Additionally, the FTCX computer as described in "High Performance Fault-tolerant Real Time Computer Architecture" published in the 1986 digest of the IEEE's 16th International Fault-Tolerant Computing Symposium, Vienna Austria, is a good prior embodiment of the base triple redundant processing core technology which is utilized as the fault tolerant processor component of this invention. Each of these examples of prior art differ most significantly from the present invention in the design of their main store component. The base technique used in the prior art to protect main store is simple replication. The main store in both the Stratus machines and in the Tandem machines are simply duplicated. The main store in the FTCX is triplicated. While replication is simple, it has several distinct disadvantages in the present application. First it is substantially less economic; the present invention is able to employ tightly synchronized parallel operation of multiple symbol planes with error correcting codes and voting to reduce the overhead for protecting the store from all faults, particularly from control or sequencing faults and from faults in support systems, such as power or clocking components. Overheads for providing this protection in the prior art systems are 100% for duplexing or 200% for triplication. This compares to an equivalent overhead of 18% in the preferred embodiment of the present invention. This is a substantial savings since the cost of these systems is dominated by semiconductor memory costs. Secondly, the tightly synchronized parallel operation of multiple symbol planes, as utilized in this invention, provides inherently higher memory bandwidths. The memory system performance of the prior art is roughly equivalent to that of a single conventionally designed memory module. The main store bandwidth of the present invention is many times that of a single module. In the preferred embodiment, the effective bandwidth is 16 times that of a single module. This combination of lower costs and higher performance makes this invention much better suited to the large shared memory application described above.

Significant components of the overall memory architecture of the present invention incorporate certain component parts known in the prior art.

The base triple redundant processing core is essentially as described in "High Performance Fault-tolerant Real Time Computer Architecture" published in the digest of the IEEE 16th International Fault-Tolerant Computing Symposium, June 1986, Vienna, Austria. FTCS Digest of Papers at pages 14 to 19.

The connections through serial voting I/O channels are very similar to those described in the previously referenced U.S. Pat. No. 5,020,023, "Automatic Vernier Synchronization of Skewed Data Structure" and in the previously referenced copending patent application Ser. No. 07/698,685 ("Nested Frame Communications Protocol").

Communications between the triple redundant processing core and the symbol planes also utilizes techniques described in U.S. Pat. No. 5,020,023 to provide for skew compensation between the multiple symbol planes and the three rails of the triple redundant core.

The error correction code utilized is as described in U.S. patent application Ser. No. 07/318,983 of S. L. Chen filed Mar. 6, 1989 entitled "Low Cost Symbol Error Correction Coding and Decoding," which is an example of a specialized Reed-Soloman ECC code. Given the structure of the present invention it is assumed that one skilled in the art might select other error correcting codes which might be better optimized for a specific size or application of this invention.

The fault tolerant clocking system, which is used to provide a synchronized time base to the multiple independent symbol planes and processing rails of the system is essentially as described in the above-referenced paper by the inventor entitled "High Performance Fault Tolerant Real Time Computer Architecture" which was presented at the IEEE 16th Annual International Symposium of Fault-Tolerant Computer Systems at Vienna, Austria.

The present invention is distinguished from the known prior art in a number of ways. For example, U.S. Pat. No. 4,653,050 discloses a means for correcting the failure of a memory module and a memory mapping mechanism to replace failed modules. The use of ECC technology is similar to the present invention in that error correction codes are used to recover data that was lost due to the failure of a single memory module. Such error correction is not unique to either invention, and is quite common in the industry. The present invention differs from U.S. Pat. No. 4,653,050 in that it also provides means for correcting or tolerating broad classes of control or sequencing failures. This is manifested in the present invention by the ECC/Voter selection circuitry described in detail subsequently. The present invention also uses a more robust (different) point-to-point connection topology than U.S. Pat. No. 4,653,050 and can thus tolerate any single point of failure in the interconnect mechanism, whereas U.S. Pat. No. 4,653,050 uses a shared bus topology with many single points of failure ill its connection mechanisms.

SUMMARY AND OBJECTS

It is accordingly the primary object of the present invention to provide a very large, highly reliable, non-volatile semiconductor memory system particularly suited for use as the central storage facility for large, on-line transaction processing systems and the like.

It is a further object to provide such a memory system which is essentially capable of prolonged error-free operation.

It is another object of the invention to provide such a system wherein the error-free operation is achieved through the use of extensive error correction and detection codes in the bulk memory array itself, triple modular redundancy in many of the control and communication modules, and the disciplined use of fault containment regions or compartmentalization to keep errors caused by faults from propagating any further than necessary.

It is yet another object to provide such a memory system wherein not only is the data content from the bulk memory array assured to be error-free by the application of error correcting codes, but means are also provided for correcting and detecting faults within control circuitry closely associated with the bulk memory.

Other objects, features and advantages of the invention will be apparent from the subsequent description of the preferred embodiment and the associated figures.

The objects of the present invention are accomplished in general by a large, highly reliable semiconductor data storage system design, which is ideally constructed from three distinctive components. The first is a bulk semiconductor memory array (DRAM). The second is a processing core, which is optimally triply redundant, and the third a plurality of channel adaptors for connecting the memory to external devices.

Each of these components is partitioned into a plurality of fault containment regions which will contain a fault to the particular fault containment region in which it occurs. The bulk memory is striped across multiple symbol planes, each symbol plane comprising a bulk memory fault containment region, such symbol plane storing at least one bit of any given memory word accessed by the system. The processing core includes error detection and correction means for error checking and correcting all data fetched from the memory and for generating correction and detection code bits for all data to be stored in memory. Each symbol plane includes means for generating a FETCH-RESPONSE control field, which precedes any data fetch from the memory and uniquely identifies said data as a response. An ECC/voter selection mechanism is provided in each processing core for continuously monitoring three or more input links from a plurality of signal planes connected to the processing core for identifying a FETCH-RESPONSE command field on that input. A majority voting mechanism is utilized to determine that the majority of the input links being monitored are carrying a FETCH-RESPONSE command field. A suitable switching means is activated to cause all subsequent data fields from all active symbol planes of the memory array to be passed through the error correction/detection circuitry. If the ECC/Voter selection mechanism detects that one or more of the FETCH-RESPONSE fields does not contain the proper FETCH-RESPONSE command when a majority of the inputs do, an error in the operation of the control circuitry in the defective symbol plane is flagged for subsequent diagnostic testing.

According to a further aspect of the invention, greater system reliability is achieved through utilizing triple modular redundancy (TMR) in the processing core, whereby the correct operation of the processing core may be assured by TMR checking of all transmissions received from the processing core by either the symbol planes in the bulk memory or by the I/O channel adapters connected to communication hardware. Also, the use of "Vernier Skew Correction" throughout the system allows significantly greater error-free output, at high data rates.

BRIEF DESCRIPTION OF THE DRAWINGS

FIGS. 2A and 2B show the connections between the processing core memory port controllers (processing core) and the symbol planes for a store and fetch operation, respectively.

FIG. 5 shows the control and data path structure of the memory port controller, generally including the ECC/Voter selection circuitry.

FIG. 6 shows the augmentations to the control and data path structure of the memory port controller required to support spare symbol plane(s) substitution.

FIGS. 7A and 7B show the scrub transmission formats between the symbol planes and the port controller and vice versa. The augmentations to the control and data path structure of the memory port controller required to support hardware assisted scrubbing of memory in the background would be obvious.

DESCRIPTION OF THE DISCLOSED EMBODIMENT

The present invention is a critical component for large, semiconductor stores which are fault-tolerant and non-volatile. Such stores can be shared by several computers, and used for file, catalog and/or other permanent storage of data in place of conventional disk storage and can be used for write-back cacheing of disk minimizing system performance requirements for the disk subsystem. Because of the significant performance differences between semiconductor memory and disk, the resultant performance of a large computer complex utilizing such a memory system can be dramatically better than that of a disk based equivalent. Neither store performance nor data integrity are affected by any single point of failure in the store or by any likely multiple fault. Reliability of the store should be at least as good as a fully duplicated (duplexed) disk storage.

Figure 1:
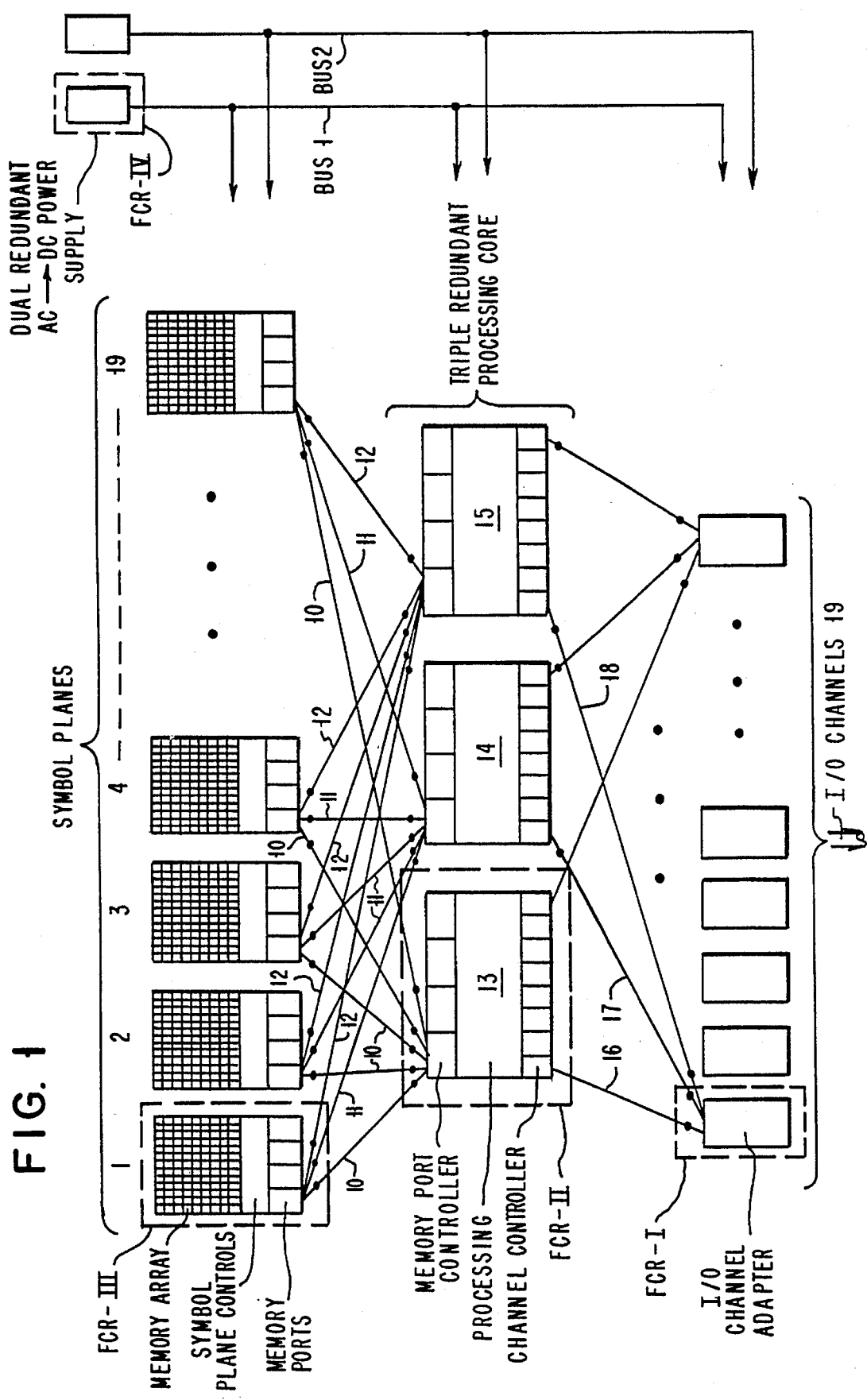
FIG. 1 comprises a high level organizational drawing showing the primary functional components of the present invention.

FIG. 1 depicts the overall organization of the store. It consists of four major subsystems:

I. An I/O channel adapter subsystem, consisting of several independent channel adapters; there being typically a separate channel for each client CPU.

II. A triple redundant control or processing core, consisting of three independent and identical processing rails which operate in tight clock synchronism with one another using identical data.

III. A bulk memory subsystem, consisting of multiple independent symbol planes which operate in tight clock synchronism with one another.

IV. A dual-redundant power system, consisting of two independent AC-DC converters which provide coarsely regulated DC power to two primary DC power distribution buses.

Each of these subsystems is made up of several Fault Containment Regions (FCR's). Briefly a FCR is a defined block of circuitry which is designed to contain the physical effects of any internal fault to that block and to be physically unaffected by faults in other FCR's. The size and partitioning of the system into FCR's is illustrated in FIG. 1 by the dotted lines enclosing one example of each type of FCR in the system. The four FCR types are the same as the four major subsystems mentioned above.

I. An I/O Channel Adapter FCR, there is one I/O Channel Adapter per installed I/O channel in the system.

II. A Processing Rail FCR, there are three Processing Rails in the preferred embodiment of the system.

III. A Symbol Plane FCR, there are 19 Symbol Plane in the embodiment described in this patent, though this number may vary as a function of the error correction codes used in a particular implementation.

IV. A Primary Power Converter FCR, there are two Primary Power Converters in the system.

All logic FCR's of the system (not applicable to the power supply) operate in tight clock synchronism with respect to one another, with each FCR independently deriving local clocking signals from triple redundant clocking signals which are broadcast from a triple redundant clock system, a portion of which is embedded in each rail of the triple redundant processing core.

All communication between these individual FCR's is through dedicated point to point links and vernier skew compensation is used to remove the effects of any residual clock skews between elements. Only a few of the dedicated communications links are shown in FIG. 1 to avoid obfuscation of the invention, but each FCR in the system is connected to each rail of the triple rail processing core by dedicated point to point links, i.e., there is a dedicated link 10, 11, 12 between each symbol plane and each rail 13, 14, 15 of the processing core and there is a dedicated link 16, 17, 18 between each channel adapter and each rail 13, 14, 15 of the processing core and there are dedicated links (not shown) fully interconnecting the three rails of the processing core one to another; there are no links interconnecting symbol planes to one another and there are no links interconnecting the channel adapters to one another.

Additionally, each FCR is independently powered, deriving regulated power from a dedicated DC-DC regulator which is part of that FCR. This DC-DC regulator provides regulated power to the FCR, as long as at least one of the two primary DC power buses remains powered.

The store is shared by and provides service to attached client computers through independent I/O channel adapter 19. Each channel adapter 19 is simplex, that is, it is without redundant elements, and the channels operate independently of one another. If a redundant connection between the store and a client computer is desired then the computer may be connected to the store through multiple channels. The channel adapter is responsible for replicating the incoming data stream and distributing identical copies to each of the rails 13, 14, 15 of the triple redundant processing core. It is also responsible for voting the triple redundant transmissions from the triple redundant processing core, to produce a single outgoing data stream for transmission by the channel adapter. This voting function masks (and detects) any erroneous transmissions from one of the processor rails of the system. In the preferred embodiment, each channel handles a serial data stream at 100 megabytes per second using a nested link protocol as described in the previously referenced copending patent application 07/698,685. The nature of this channel protocol is not central to the present invention and any number of alternate channel protocols, such as IBM's ESCON fiber optic serial channel protocol could be used. For performance and data latency reasons and to most fully exploit the advantages of semiconductor memory, it is desirable that the channels operate at as high a data rate as possible and that they be optimized for minimal latency.

Messages between the data store and client computers are processed by the triple redundant processing core 13, 14, 15. Each rail of this processing core operates in tight clock synchronism with the other two rails, performing identical functions on identical data within each rail. Any single rail failure which produces erroneous transmissions from that rail can be masked by the receiving FCR's by voting circuitry. The design of and operation of the triple redundant core is similar to that described in the referenced publication on the FTCX computer, with vernier skew compensation augmentations and improvements. Vernier skew compensation allows higher speed operation of the core and higher bandwidth transmissions between the rails of the core and between the core and the surrounding FCR's. This is because skew otherwise limits both bandwidth and operational speeds. Thus, correcting it permits increasing both.

In the disclosed embodiment a skew compensation module (skew ckt) would be located at the receiving end of all links. These would be located in the receiver circuitry in each memory port in each symbol plane and similarly in the receiver circuitry associated with each link in each memory port controller in the processing core.

Also in each of the processing core rails there would be a skew ckt in the receiver circuitry in each channel controller and in the receiver circuitry in each channel adaptor.

It is farther noted in FIG. 1 that links which include skew compensation modules as part of their receiver circuitry are marked on the links by an enlarged dot. These skew modules would normally be physically within the functional blocks which they serve as part of that block's receiver circuitry. It is also noted that each of the parallel data links is shown by a single line, each of the links 10, 11, 12 being 9 bits (8 data, 1 control) wide and each of the links 16, 17, 18 being 128 bits (16-8 bit bytes) wide.

Within this context, the present invention provides for the parallel operation and control of multiple symbol plane FCR's by memory port controllers in the processing core.

Data is economically stored by striping it across the multiple symbol planes such that any data lost due to the failure of any single symbol plane can be reconstructed by means of a combination of voting and error correction circuitry within the memory port control circuitry of the processing core. The parallel operation of multiple symbol planes also provides for intrinsically high memory bandwidth.

Figure 2B:
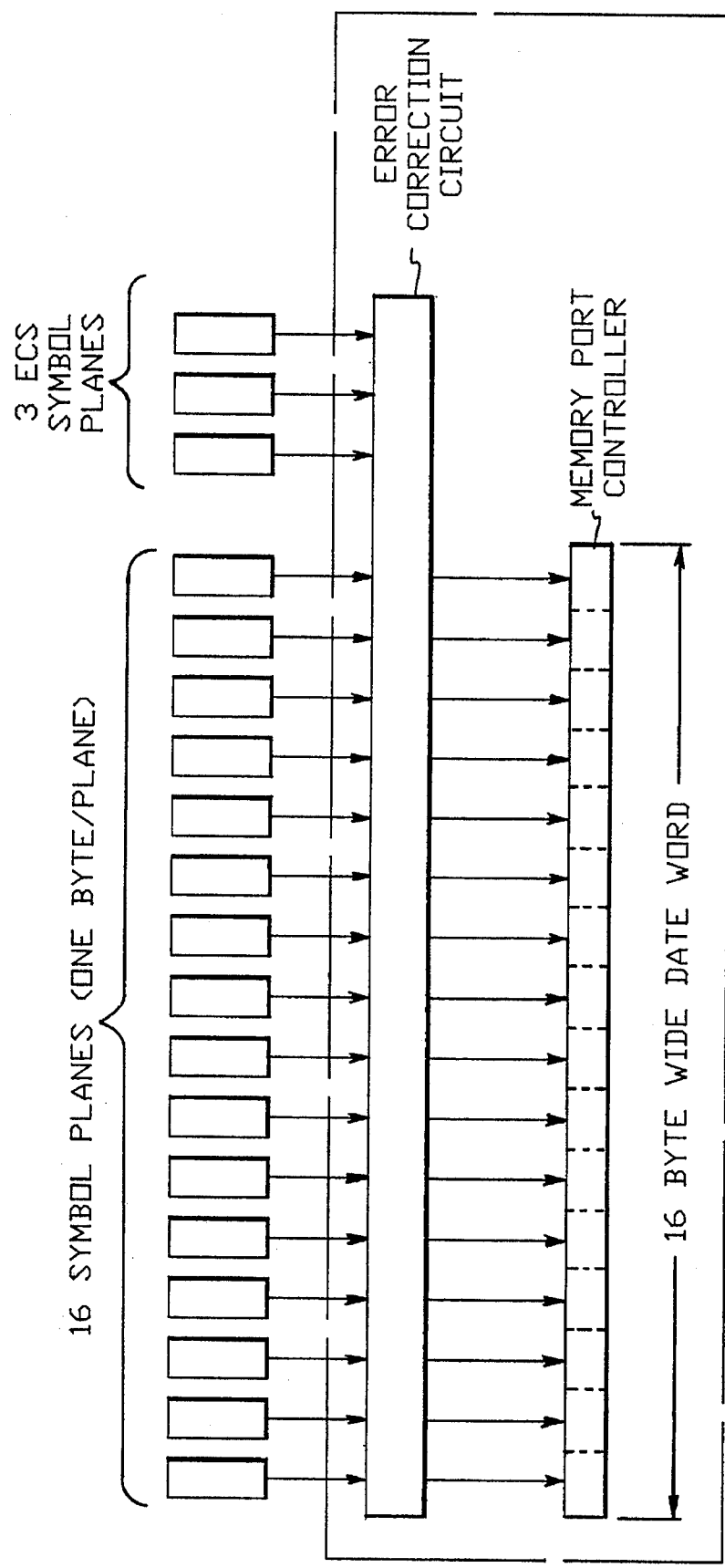

FIGS. 2A and 2B illustrate the means for striping data across multiple symbol planes. In this preferred embodiment, 16 symbol planes are used to store data symbols and 3 symbol planes are used to store error correcting symbols. Further in this embodiment each symbol is an eight bit byte of data. In effect, each 16 byte (128 bit) word of data is striped across the 16 symbol planes with one byte stored in each of 16 data planes. The memory port controller additionally computers three Error Correction Symbols (ECS) per 16 byte word and stripes these across the three ECS planes, storing them as it stores the data. The connection between the memory port controller, within a rail of the processing core, and each of the symbol planes is by a dedicated point to point serial link.

Figure 3:
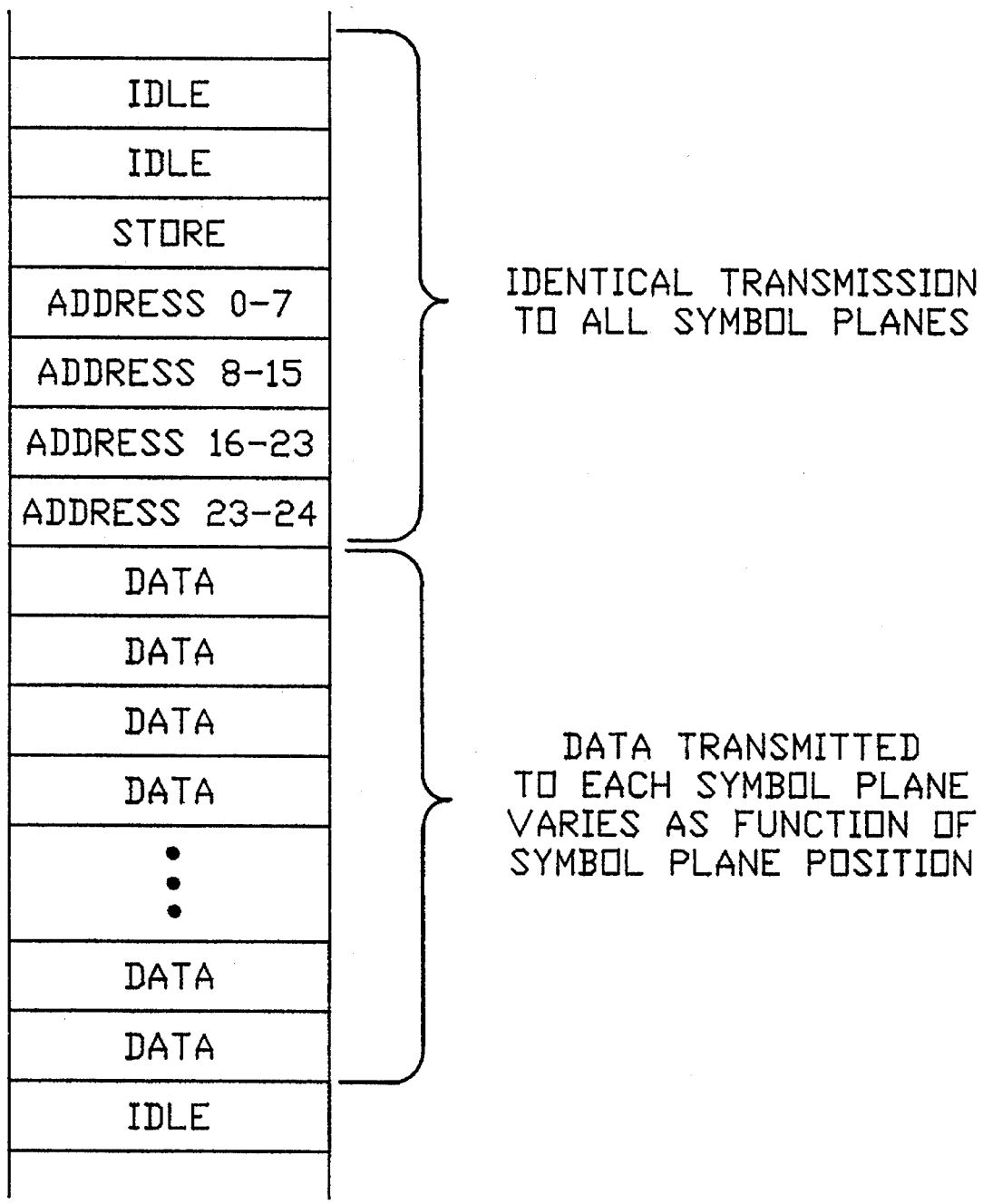
FIG. 3 illustrates the format for the port controller STORE command transmission.

The format for the port controller to symbol plane command and data stream is shown in FIG. 3. This data stream can be thought of as consisting of a serial stream of 9 bit control/data symbols. Bit 0 of that symbol indicates whether the control/data symbol is a control symbol or a data symbol. Bits 1–8 of the symbol are either a data byte (Bit 0=0) or a control byte (Bit 0=1). IDLE control symbols are transmitted between frames. For a simple STORE request the first symbol of the frame contains the STORE control code, followed by four data symbols containing the word address in which the data is to be stored, followed then by the actual data to be stored. The data block to be stored is of variable length, and the end of the data block is delimited by an IDLE symbol or another control symbol marking the beginning of a new frame. In the preferred embodiment, the transmission rate for this serial data stream is at 25 million symbols per second. Note that the transmissions of the control code, and address fields to each of the symbol planes are identical, that is these fields in all 19 transmissions to each symbol plane are identical. This is because all symbol planes operate in exact synchronism with one another, and thus must all receive identical requests insofar as operation requested is concerned. The effective transmission rate of the command portion of the frame is thus at the basic symbol transmission rate for one link. In this embodiment, this is at 25 million symbols per second. Since different data is stored in each symbol plane, the effective data rate for the data field of a transmission is higher, with each symbol plane only receiving a unique copy of the data to be stored in that plane. In this embodiment with 16 data planes the effective transmission rate of the data to the bulk symbol plane memory subsystem is at 400 million bytes of data per second (plus 75 million ECS bytes per second to the 3 ECS planes). Note that the transmission bandwidth to an individual symbol plane is still only at 25 million bytes of data per second. In this embodiment with a triple redundant processing core, each symbol plane receives a triple redundant copy of each command and data frame. It votes the triple redundant transmission on a symbol by symbol basis (either command or data) to mask and detect any erroneous transmissions from one of the rails.

In the preferred embodiment, the processing core may be populated with from one to four memory port controllers depending upon the number of and character of the installed I/O channels. Each symbol plane call be configured to support from 1 to 4 independent ports to match these processor configurations. Each of the ports resembles and is a duplicate of the single port just described, including a triplicated port controller within the triplicated processing rail and dedicated links from each port controller to the memory port in each of the symbol planes.

Figure 4A:
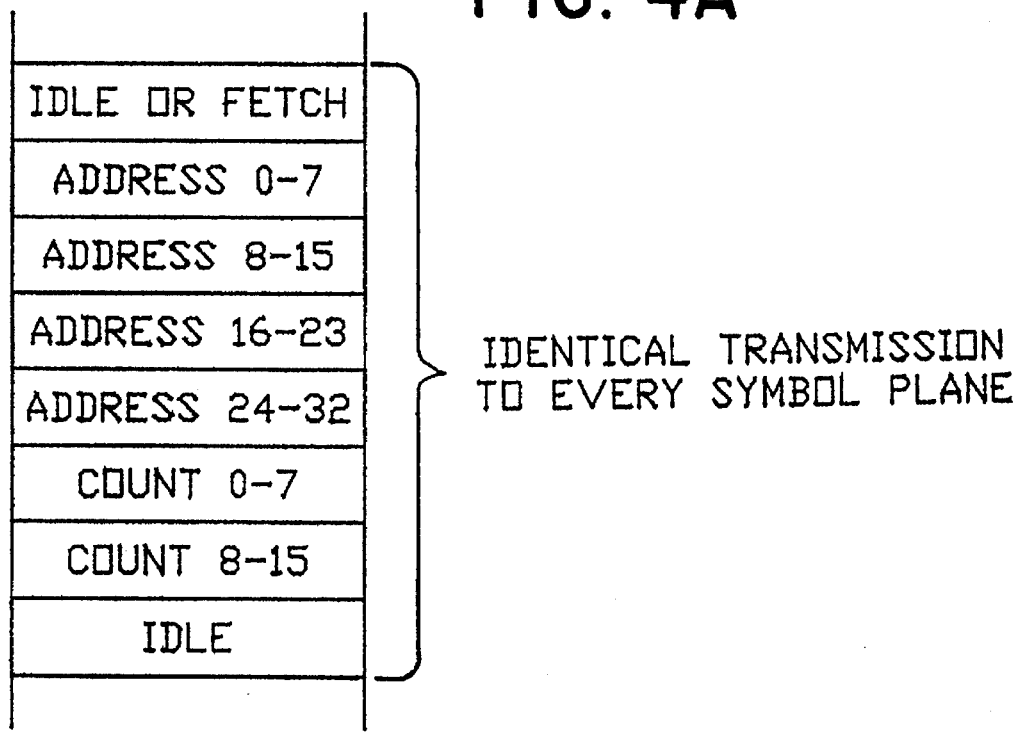
FIGS. 4A and 4B illustrate the port controller FETCH command transmission format and the symbol planes FETCH RESPONSE transmission format, respectively.
Figure 4B:
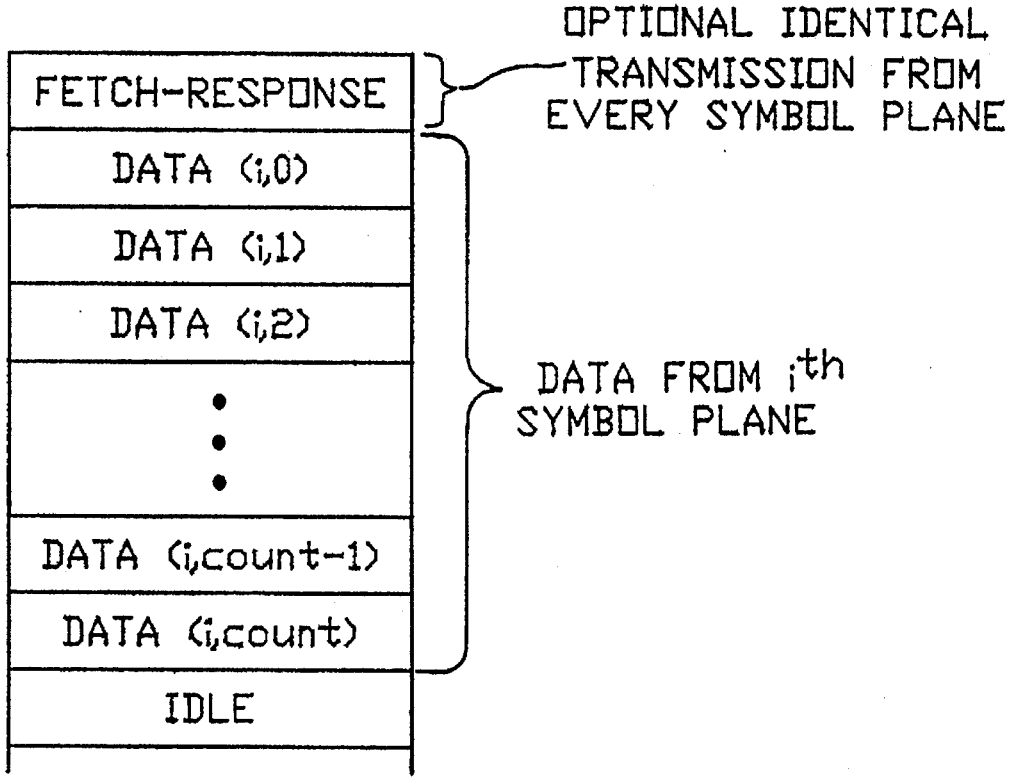

The format of a FETCH request is shown in FIG. 4A. The first four symbols are data symbols and contain the address of the first 16 byte word to be fetched, followed by two data symbols containing the block size. Note that the FETCH request is implicit, a data symbol following an IDLE is the first byte of the address of an implied FETCH. This reduces FETCH latency by one cycle. If a FETCH is to directly follow another frame, then it is delimited by the insertion of an explicit FETCH control symbol preceding the fetch address. Note also that the transmission of the address is ahead of the block size. This allows the FETCH operations to be initiated as soon as adequate information is available to begin a memory cycle (presuming the memory is idle), further reducing FETCH latency. The reply format from the symbol plane to the memory port controller is also shown in FIG. 4B. As with the FETCH command format, the response format is optimized for good FETCH latency, and the symbol plane simply begins transmission of the data block. If the first symbol of a response frame following an IDLE is a data symbol then this is an implicit FETCH-RESPONSE frame. As with the FETCH request frame, if this response frame is to immediately follow a preceding response transmission, then the two are separated by an explicit FETCH-RESPONSE control code.

FIG. 5 illustrates the structure and data flow of the receiver portion of a processing core port controller which is a very significant feature of the present invention. It is this mechanism, referred to herein as the ECC/Voter selection mechanism which implements the means for correcting both data and control or sequencing information faults of a symbol plane. In summary, data faults are corrected by application of error correction codes and control or sequencing information faults are corrected by majority voting logic. The ECC/Voter selection mechanism provides means for selectively switching between the application of error correcting codes to data and majority voting to sequencing information which is immune to any failure of a symbol plane or of one of the links interconnecting the port controllers and the memory ports in the symbol planes. Such means is described in detail below.

Such a mechanism is located in each rail of the triplicated processing core of the preferred embodiment.

It should also be noted that the symbol planes may be multiported and that this is accommodated by having a matching dedicated memory port controller within the processing core for each memory port. In this preferred embodiment there are four memory ports. Thus there would be a total of 12 port controllers, four in each rail.

It is further noted that this means would be fully operable and effective against symbol plane or link failures, regardless of whether the individual processing cores are TMR'd.

In detail, since each of the symbol planes operate in tight synchronism with one another, a port controller will receive simultaneous and tightly synchronized replies from all symbol planes in response to a FETCH request. These are processed through the ECC/Voter selection circuit to mask or correct any symbol plane failures. The structure of this ECC/Voter selection circuitry is illustrated in FIG. 5. Note that the control or sequencing information symbols in a response are always identical across all 19 parallel data streams, but the data symbols being fetched would normally differ from symbol plane to symbol plane. A subset, i.e. 1 bit, of the symbol plane transmissions, is used to determine if a symbol is data or control information. In the preferred embodiment, the control/data symbols from the three ECS symbol planes are individually examined in Voter 50 to determine if they are control or sequencing information symbols. A vote among these three symbol planes is taken on the single bit in voter 50 to determine if the symbol is such a command or data symbol. If it is determined that the symbol is such a command symbol then a further vote is taken in voter 51 to determine that symbol. In effect, the voter 51 mechanism constructs a command stream by voting among the three ECS symbol planes and this command stream is then used to drive the port controller's receiver state machine 52. Visible in this constructed control stream are all received command symbols (IDLE, FETCH-REPLY, etc..) and in addition a single pseudo control symbol, DATA, which is substituted for any data symbols in the received data stream. Note, since this command stream is constructed from a vote among three symbol planes and since it is assumed that no more than one symbol plane can fail at one time, this constructed command stream will be correct despite a failure in the control circuitry of any single symbol plane control fault. If the failed symbol plane is an ECS plane then it is outvoted. Failures in any of the data planes cannot corrupt the constructed command stream as they have no role in its construction.

The symbols from the 16 data planes may be additionally compared for agreement with the constructed command stream in order to detect and report any data symbol plane failures, but this is not central to the present invention's primary function and could be deleted. It should also be noted that the choice of which three symbol planes are to be used in the construction (voting) of the response control stream is arbitrary, the choice of the three ECS planes was made on aesthetic grounds in the preferred embodiment.

The port controller's receive state machine 52 is responsible for directing data to the error correction circuitry 53 or data selection circuitry 54 as dictated by the output of Voter 51 and MUX 53. In the case of a FETCH, the port controller is waiting for the response data, and will direct the 19 byte wide data stream to the error correction circuitry 53 starting with the first DATA symbol following an IDLE or FETCH response code. This error correction circuit, outputs a 16 byte data word each cycle which it derives from the incoming 16 data bytes and 3 ECS bytes. The error correction code implemented in the preferred embodiment can completely correct any missing or erroneous byte (either a single data byte or single ECS byte) and it can additionally detect any two byte failures. The error correction circuitry is selectively enabled and disabled since not all symbol positions in the incoming data stream contain striped data front the symbol planes. This selective enabling and disabling of input to the error correction circuit is the responsibility of the port controller's receive state machine and associated circuitry comprising the ECC/Voter selection mechanism. For the FETCH-REPLY the ECC circuitry is disabled or idle for the cycle in which the FETCH-REPLY command is received and is enabled or active for the stream of data symbols which follow until the end of the transmission which is marked by an IDLE or reply command symbol for the next transmission. The ECC circuitry is disabled when this IDLE or command symbol is received.

In addition to the obvious STORE and FETCH symbol plane request/response operations, the port controller also includes mechanisms for fetching certain symbol plane status information from the symbol planes, and storing configuration and control information into the symbol plane.

Status information frequently differs from plane to plane. For example, the preferred embodiment uses conventional error correction mechanisms internal to the symbol plane to mask soft errors in a symbol plane's memory array DRAM (most frequently caused by Alpha particle radiation). These errors are corrected and the error event is recorded in a symbol plane status array, internal to the symbol plane. The data transmitted from the symbol plane to the memory port controllers in the processor rails is already corrected and this type of error event is therefore invisible outside the symbol plane. It is also unique to the symbol plane in which it occurred, since it is unlikely that two symbol planes will have identical soft errors at the same time.

The port controller implements a function to allow the fetch of this internal status array from a symbol plane. The port controller performs a status fetch from a symbol plane as follows. It transmits a STATUS-FETCH command to the target symbol plane. In parallel it transmits a DUMMY-STATUS-FETCH to the other symbol planes. This allows them to perform dummy operations which parallel the real STATUS-FETCH operations in the target symbol plane so as to maintain tight synchronism among all symbol planes. All symbol planes then reply with STATUS-FETCH-REPLY, but only the target symbol plane returns status data. The other symbol planes return zeroes in the data field (again maintaining synchronous operation). The port controller receiver state machine 52 is then responsible for directing the parallel transmissions from all symbol planes to a data selector 54 and for controlling that selector, so as to select the transmission from the target symbol plane. Note that the identity of the target symbol plane is known to the port controller since it originated the request and is awaiting the response.

The port controller also implements CONTROL-STORE, and DUMMY-CONTROL-STORE commands for configuring and controlling internal symbol plane circuitry. These can be used to reset various error status indications, such as might be generated by soft DRAM errors in a symbol plane, and for routine reconfiguration commands. Adjusting for different sizes and configurations of installed memory within a symbol plane is a good example. In the preferred embodiment, a CONTROL-STORE frame is also used to synchronize DRAM refresh activity across all symbol planes during power-up initialization.

For all requests to the symbol plane it is impossible for the port controller to predict actual response times, so the processing of response command symbols through the response command voter is central to the present invention.

The timing of a FETCH response is dependent upon many interference effects, such a DRAM refresh, or interference from other ports. The port receiver circuitry relies upon this voter to extract necessary sequencing information to drive its controlling state machine. In the case of the STATUS-FETCH, sequencing information is most frequently extracted from the transmissions from symbol planes which are actually performing DUMMY-STATUS-FETCH operations. Specifically, in the preferred embodiment, when any STATUS-FETCH is directed at a data plane, then the sequencing information is solely derived from symbol planes performing DUMMY-STATUS-FETCH operations.

Enhancements to the Underlying Invention

Within the context of the underlying invention, certain optimizations and features could be added to optimize the implementation for a specific application. Three specific invention enhancements are described below, 1) Symbol Plane Sparing, 2) Alternate Error Correcting Codes, and 3) Symbol Plane Scrubbing to facilitate concurrent repair and upgrade of the symbol plane memory.

Symbol Plane Sparing

It is very possible that some means for electronic repair of a system with a failed symbol plane be provided. Such a situation would most frequently occur when the symbol plane memory system is very large, and when it is desirable to defer repair, possibly due to the remoteness of the system installation. This can be facilitated by providing one or more additional spare symbol planes which can be electronically substituted to replace the failed plane. In the preferred embodiment above, if a single spare were provided, this plane would constitute a 20th (spare) plane. This plane could be substituted for any one of the other 19 symbol planes. FIG. 6 illustrates a preferred implementation for enhancing the invention to allow for electronic repair.

For transmissions to the symbol planes a single 19 to 1 multiplexor 60 selects one of the 19 parallel port controller transmissions for transmission to the spare symbol plane. This multiplexor is configured by a maintenance process (software) running in the processing core and directs that a copy of the transmissions to the symbol plane being replaced be additionally sent to the spare plane. For example if plane 7 is being replaced then the multiplexor is configured to select the transmissions to plane 7 for transmission to the spare plane.

The port controller additionally includes 19 two-to-one multiplexors, 62. These multiplexors are normally configured to pass the transmission from the respective symbol planes to the port controller. When electronic repair is required the transmissions from the spare symbol plane are substituted for the transmissions from the failed symbol plane. For example if plane 7 is being replace then the 2:1 multiplexor for plane 7 is configured to substitute the received signals from the spare symbol plane for the received signals from plane 7.

The electronic repair procedure would then be to configure the single 19:1 multiplexor 60, and one of the 19 2:1 multiplexors 62 to electronically replace the failed symbol plane with the spare. The content of the spare symbol plane can then be loaded by reading the entire content of the bulk memory from the symbol plane array, and writing it back to symbol plane memory. During the read operation, the missing information from the failed symbol plane is reconstructed by the error correction circuitry in the port controller. During the write phase this reconstructed data is then written into the spare plane. At the end of this scrubbing operation the spare has been loaded with the reconstructed data that was lost when the original symbol plane failed. This scrub operation can be performed by a simple program which loops reading and writing all of memory or it could be hardware assisted as described below.

Alternate Error Correction Codes

The preferred embodiment above uses a single-byte-error-correct/double-byte-error-detect error correction code as described in said previously referenced copending U.S. patent application Ser. No. 07/318,983 of S. L. Chen. Alternate error correction codes could be utilized to optimize different applications. For example, the double error detection capability of this code may not be required for some applications as the exposure to double errors is brief; the exposure is only until repair is effected. Only two error correction symbols are required for single byte error correction without double byte error detection. This is more economic, reducing the redundancy overhead from 18% to 12%.

Hardware Assisted Memory Scrubbing

Many of the configuration changes require that all of memory be scrubbed, that is the entire content of memory must be read from the symbol planes and then rewritten. The example above which describes the procedure for swapping in a spare symbol plane is only one of several situations which can arise where scrubbing is necessary. Concurrent repair and concurrent additions to memory also require scrubbing operations. The time to scrub memory can be very long for large memories when it is entirely driven by program execution of a FETCH/STORE loop. This FETCH/STORE loop can also interfere with the operation of other software in the machine since a word must be locked during FETCH/STORE to prevent an intervening but otherwise normal STORE from being overwritten by the STORE portion of the FETCH/STORE operation.

The symbol planes and memory port controllers in the preferred embodiment include a hardware assist to perform a high speed software transparent scrub of memory, utilizing unused memory bandwidth. A hardware scrub is initiated by a CONTROL-STORE command to all symbol planes in parallel. The starting address and length of the memory range to be scrubbed are stored into special scrub control registers in each symbol plane. The symbol plane then initiates and controls the scrub. Each word is fetched from symbol plane memory and sent to the memory port controller. The format is shown in FIG. 7A. The memory port controller when it receives a scrub word or stream of words passes the data through the error correction circuit and wraps the data back to the symbol plane. The format for the retransmission to the symbol plane is shown in FIG. 7B. When the scrubbed data is received by the symbol planes, it overwrites the previous content of that memory location, effectively reloading the content of that word with corrected data. Scrub transmissions in either direction may be preempted at anytime to allow for normal memory traffic, and access to the memory array itself within the symbol plane is first granted to normal memory traffic on a priority basis. Scrubbing thus has a minimal effect on normal use of the memory. Since there is some pipeline latency between when a word is first read by the scrub mechanism, and when it is rewritten, normal memory traffic is monitored by the symbol plane to determine if any attempt is being made to store to a memory location being scrubbed during this latency period. If an attempt is made to write to a memory location which has been read by the scrub hardware and which has not yet been rewritten, then the normal write proceeds and the rewrite of the scrub data to that location is canceled. The scrub hardware then backs up and retries the scrub from that point, discarding the data in the pipeline. Note that the pipeline effects in the transmissions to the memory port controller, through the error correction circuits, and from the port controller back to the, symbol planes means that there may be several scrub words in flight at any time. Since memory location conflicts between normal memory activity and the scrub are extremely rare, scrub retry should have no effect on scrub performance.

In the preferred embodiment the hardware assisted scrub is fully pipelined in the background and can proceed at the full port bandwidth when no other memory activity is present at that port. This allows the entire memory to be scrubbed at close to the 400 megabytes per second with minimal impact on the performance of normal software running in the system.

It will be apparent from the preceding discussion that many other changes in the form and detail of the underlying invention may be readily made by those skilled in the art without departing from the spirit and scope of the present invention as set forth in the specification and claims. Many other enhancements may also be added to achieve still greater reliability, speed and general versatility of such a highly reliable memory architecture.

I claim:

1. A large, fault tolerant, highly reliable semiconductor data storage (memory) system in which a memory function is striped across multiple symbol planes, which comprise memory fault containment regions, each memory fault containment region including each said symbol plane which stores at least one bit of any given memory word accessed in the semiconductor data storage system, a processing core including at least a memory port controller for accessing the multiple symbol planes in parallel, said memory port controller further including an error correction/detection mechanism for error checking all data fetched from the memory and for generating error correction and detection code bits for all data to be stored in memory, each said symbol plane including means for generating FETCH-RESPONSE sequencing information which signals the arrival of any data fetched from memory at the memory port controller and thence to a requesting processor or link, said sequencing information being generated in each symbol plane, an ECC/Voter selection mechanism in each said processor core for continuously monitoring a plurality of input links from a plurality of signal planes to identify FETCH-RESPONSE sequencing information on the input to said processing core, said selection mechanism including majority voting means to determine that a majority of the input links being monitored contain such FETCH-RESPONSE sequencing information, means responsive to such determination for enabling the error detection/correction circuit means in said processing core to check all data appearing on the input links from the symbol planes for errors subsequent to the receipt of said FETCH-RESPONSE sequencing information, said error correction circuitry remaining in the disabled state until such sequencing information is detected.

2. A data store system as set forth in claim 1 wherein the complete processing core is triplicated to form three processor rails,
   each rail connected on one side to data links to and from all of the symbol planes, and on the other side connected to data links between the processing core and channel adaptors for communication with other components connected to the memory system,
   each symbol plane and each channel adaptor having a data path between itself and each of the three processing core rails and also including voter means in the three data paths for selecting a 'majority vote' output for any data and control information received from said three rails.

3. A data store system as set forth in claim 1 wherein said processing core includes a separate selector multiplexer switch directly connected to the inputs from all said symbol planes, operable to select as data input, only one of said symbol planes and means for causing all symbol planes not selected to produce dummy data even though their symbol plane data is not selected.

4. A data storage system as set forth in claim 2 wherein each of the processor core rails includes a separate selector multiplexer switch operable to select a data segment transmitted from a predetermined one of the symbol planes attached to the processing core for selecting and transmitting said selected data segment to a requesting processor.

5. A data storage system as set forth in claim 1 wherein data links between symbol planes and processing cores are provided with means for vernier skew adjustment, all said vernier skew adjustment means operating from a single master system clock, all data transmitted between any processing core and the symbol planes in the data storage system being synchronized and aligned with the master system clock to better than a predetermined maximum skew tolerance, with compensation for skew less than said maximum being provided by said vernier skew means.

6. A data storage system as set forth in claim 2 wherein each symbol plane, each processing core rail and each channel adaptor constitute additional fault containment regions and wherein the data paths and control circuitry in any fault containment region is so configured that a fault therein may not be propagated to another fault containment region.

7. A data store system as set forth in claim 1 including at least one spare symbol plane in the memory and including switching means operable under control of diagnostic circuitry for reconfiguring the data paths between the processing core inputs and the spare symbol plane so that the spare symbol plane receives all data intended for and returns all data which would normally come from a symbol plane designated as "unusable" by the diagnostic circuitry.

8. A data store system as set forth in claim 1 wherein each symbol plane is multiported and wherein there are as many processing core port controllers as there are ports in said symbol planes and wherein each processing core port controller includes link means for connecting the channel to a predetermined port in every symbol plane, a complete ECC/Voter selection mechanism, error detection/correction mechanism and means for energizing the error detection/correction mechanism subsequent to the receipt of a FETCH-RESPONSE control signal.

9. A data storage system as set forth in claim 2; including a fully redundant primary power supplies for the complete data store system, and a battery backup provided for at least the semiconductor memory to maintain data stored therein for an extended period, should external primary power be lost.

10. A data store system as set forth in claim 2 wherein each symbol plane is multiported and wherein there are as many processing core port controllers in each rail as there are ports in said symbol planes and wherein each processing core port controllers includes link means for connecting the channel to a predetermined port in every symbol plane, a complete ECC/Voter selection mechanism, an error correction/detection mechanism and means for energizing the error detection/correction mechanism upon the receipt of a FETCH-RESPONSE control signal, and link means connecting the channel to a predetermined channel link adaptor.

11. A data storage system as set forth in claim 2 wherein data links between symbol planes and processing core rails are provided with means for vernier skew adjustment, all said vernier skew adjustment means operating from a single master system clock, all data transmitted between any processing core rail and the symbol planes in the data storage system being synchronized and aligned with the master system clock to better than a predetermined maximum skew tolerance, with compensation for skew less than said maximum being provided by said vernier skew means.

12. A data store system as set forth in claim 2 including at least one spare symbol plane in the memory and including switching means operable under control of diagnostic circuitry for reconfiguring the data paths between the processing core inputs in each processor rail and the spare symbol plane so that the spare symbol plane receives all data intended for and returns all data which would normally come from a symbol plane designated as "unusable" by the diagnostic circuitry.

13. In a large fault tolerant, highly reliable semiconductor data storage (memory) system in which a memory function is striped across multiple symbol planes, each symbol plane storing at least one bit of any given memory word accessed in the system, said data storage system having
   a processing core module, including at least one memory port control and channel port control for selectively connecting the memory to high speed communication links, via channel adaptors, for communicating with other functional entities attached to the data store system, said processing core further including an error correction/detection mechanism for error checking all data fetched from the memory and for generating error correction and detection code bits for all data to be stored in memory, each said symbol plane including means for generating FETCH-RESPONSE sequencing information which must precede any data fetched from memory and returned to the processing core, said sequencing information being generated in each symbol plane,
   an ECC/Voter selection mechanism in each said processing core for continuously monitoring a plurality of input links from a plurality of signal planes to identify FETCH-RESPONSE sequencing information thereon, said mechanism including a majority voting means to determine that a majority of the input links being monitored contain such a sequencing information field, and,
   switching means for enabling the error detection/correction mechanism in said processing core to check all data appearing on the input links from the symbol planes for errors subsequent to the receipt of a FETCH-RESPONSE sequencing information,
   a method for assuring the correct operation of the control circuitry built in the symbol planes, said method comprising:
   1. determining that sequencing information is on the plurality of monitored input links from the symbol planes, 2. determining that the same sequencing information has been detected on a majority of the input links, and
  3. causing the error detection/correction circuitry to process all subsequent data transmission to the processing core.

14. A method as set forth in claim 13 wherein said method includes notifying a diagnostic module of a sequencing information error if one of the monitored links does not agree with the others.

15. A method as set forth in claim 14 including varying the particular inputs being tested for sequencing information by the ECC/Voter selection mechanism on a predetermined cyclical basis, to periodically check the operation of the control circuitry associated with each of the symbol planes.

16. A method as set forth in claim 13 wherein said method includes performing a hardware assisted scrub in the symbol planes by issuing a CONTROL-STORE command to all symbol planes, said command providing a starting address and a number of words to be scrubbed, transferring control of the scrub to the symbol planes, said symbol planes transmitting sequential words to the symbol plane port controller in the processing core, the symbol plane port controller recognizing SCRUB commands utilizing the ECC/Voter selection mechanism and reconstructing any data missing from a unitialized or improperly loaded symbol plane by utilizing the data and ECC symbols from the other symbol planes, the symbol plane port controller recomputing the ECC symbols and returning the corrected data and recomputed ECC symbols to the symbol plane port, and the symbol planes storing said data and ECC symbols overwriting any erroneous symbols.

17. A method as set forth in claim 16 wherein the memory scrub operation is pipelined, any attempt to write to a location whose content is in the scrub pipeline is detected by the symbol plane scrub means, causing the contents of the pipeline to be discarded and the scrub to be reset to a point prior to the location corresponding to the content of the discarded portion of the pipeline.

* * * * *